United States Patent [19]

LeRoux et al.

[11] Patent Number: 4,788,501

[45] Date of Patent: Nov. 29, 1988

[54] METHOD FOR CALIBRATING A RADIOFREQUENCY EXCITATION IN NMR EXPERIMENTATION

[75] Inventors: Patrick LeRoux, Paris; Alain Marilier, Bourg La Reine, both of France

[73] Assignee: Thomson-CGR, Paris, France

[21] Appl. No.: 37,342

[22] Filed: Apr. 13, 1987

[30] Foreign Application Priority Data

Apr. 15, 1986 [FR] France ............................ 86 05365

[51] Int. Cl.[4] ............................................ G01R 33/20
[52] U.S. Cl. ..................................... 324/314; 324/307
[58] Field of Search ................. 73/1 R; 324/313, 314, 324/307, 309

[56] References Cited

U.S. PATENT DOCUMENTS

| 4,291,272 | 9/1981 | Hofer et al. | 324/313 |
| 4,379,262 | 4/1983 | Young | 324/313 X |
| 4,602,213 | 7/1986 | Sugiura | 324/313 X |
| 4,720,678 | 1/1988 | Glover et al. | 324/314 X |
| 4,739,267 | 4/1988 | LeRoux et al. | 324/307 X |

FOREIGN PATENT DOCUMENTS

| 0175611 | 3/1986 | European Pat. Off. |
| 2053481 | 2/1981 | United Kingdom |

OTHER PUBLICATIONS

Proceedings of an International Symposium on NMR Imaging, Oct. 1981, pp. 33-39, Bowman Gray School of Medicine of WakeForest University, Winston Salem, N.C., U.S.; D. I. Hoult: "Radio Frequency Coil Technology in NMR Scanning".
Patents Abstracts of Japan, vol. 9, No. 253 (P-395) [1976], 11 Oct. 1985; & JP-A-60 104 243 (Nippon Denshi K.K.) 08-06-1985.

Primary Examiner—Tom Noland
Attorney, Agent, or Firm—Oblon, Fisher, Spivak, McClelland, & Maier

[57] ABSTRACT

Size variation of samples subjected to NMR examinations entails the need for calibration of the radiofrequency excitation which gives rise to the resonance phenomenon measured during experiments. Determination of the most suitable value of the radio-frequency excitation amplitude is carried out by scanning the range of potential amplitudes, starting from one end of the range. During the scanning operation, the variation in excitation amplitude varies in a geometrical progression with the order number of the experimentation. It is shown that, by adopting this procedure, determination of the calibrated amplitude is achieved more rapidly while maintaining constant accuracy of determination.

7 Claims, 2 Drawing Sheets

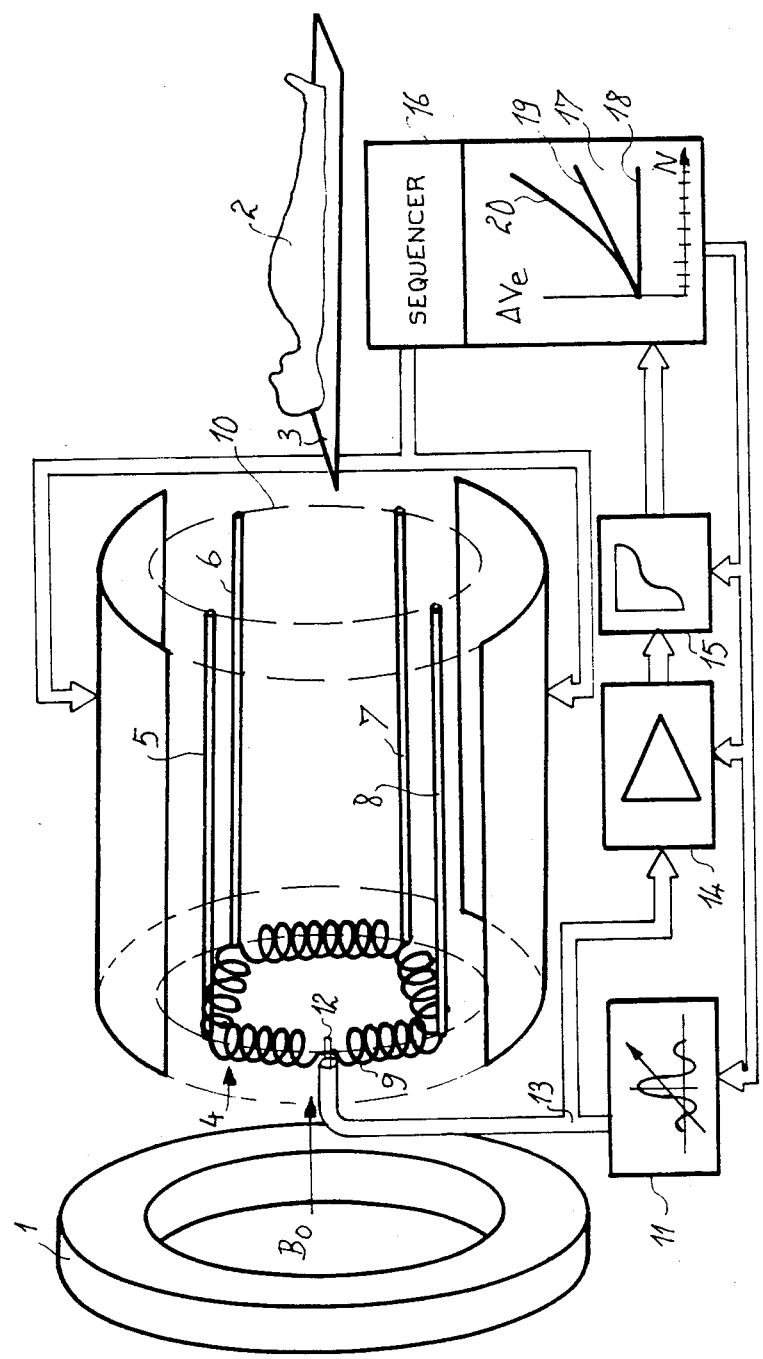
FIG_1

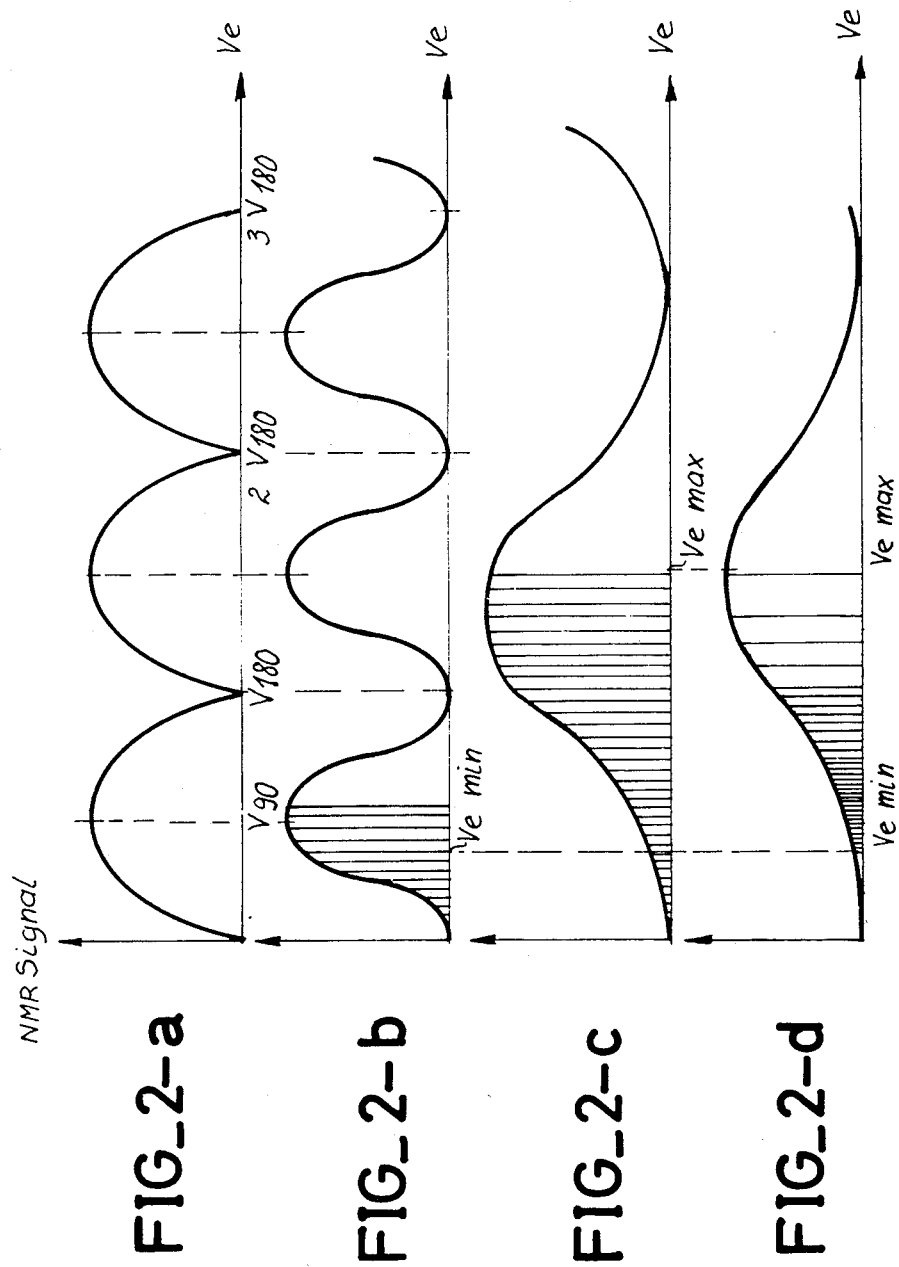

METHOD FOR CALIBRATING A RADIOFREQUENCY EXCITATION IN NMR EXPERIMENTATION

BACKGROUND OF THE INVENTION

1. Field of the Invention

This invention relates to a method for calibrating a radiofrequency excitation in nuclear magnetic resonance (NMR) experimentation. The object of NMR experiments is to permit nondestructive and noninvasive determination of the intrinsic nature of bodies. Such experiments are carried out in conjunction with imaging techniques, particularly in the medical field, in order to produce images representing human-body cross-sections of patients under examination.

2. Description of the Prior Art

An NMR experiment is performed under the following conditions: a body to be examined is subjected to the influence of a steady and uniform magnetic field of high strength. The magnetic moments of the body particles then have a tendency to align themselves with the orientation of the magnetic field considered. If these particles are subjected to a radiofrequency excitation of short duration, thus inducing a signal at a so-called resonance frequency, this will permit a change in orientation of said magnetic moments. When the excitation is discontinued, these moments tend to revert to the initial orientation by precessing. The precession frequency or so-called Larmor frequency is also the resonance frequency and is related to the value of the orienting-field strength by a coefficient $\gamma$ known as the characteristic gyromagnetic ratio of the body. The precession signal is detected and the data relating to the body are drawn from the signal.

If the angle of slope of the magnetic moments of the particles subjected to the excitation is related to the orientation of the orienting field, it is observed that the amplitude of the response signal emitted by the body varies as the sine of said angle. If the excitation is a so-called 90° excitation, the response-measured signal is in this case of maximum value. In order to obtain an enhanced signal-to-noise ratio of the response-detected signal, it is consequently useful to determine the amplitude of excitation which corresponds to this 90° change in orientation of the magnetic moment of the body particles.

It may be stated in very broad terms that, in a body of given nature, the amplitude of the excitation electromagnetic field is proportional to the intensity of a so-called antenna current which passes within the radiofrequency excitation means. If said radiofrequency excitation field is designated as $B_1$ and the antenna current is designated as $I_a$, we may write:

$$B_1 = k \cdot I_a$$

where k is a proportionality factor. Assuming the absence of an antenna-matching circuit, it appears that the antenna current $I_a$ is proportional to the square of the voltage $V_e$ delivered by a generator for supplying the radiofrequency excitation means, divided by the sum of the antenna resistance and the body resistance. Now it is a known fact that the body resistance with respect to the entering electromagnetic wave is approximately proportional to the fifth power of the diameter of said body. In other words, depending on whether the body to be examined is that of a patient of small stature (low resistance) or on the contrary of large stature (high resistance), calibration of the generator voltage extends over a broad range. It is known that the voltage of the generator must be calibrated between 50 and 150 volts, for example. All other things being equal, these considerations are equally valid in conventional NMR when choosing samples of different sizes.

Once a patient is in position within an NMR scanner, the first operation to be performed accordingly consists in calibrating the 90° excitation in order to establish optimum conditions of examination. In examination techniques which involve the emission of excitations in accordance with the spin echo technique or of 180° excitations, the problem is similar. In the case just mentioned, however, instead of calibrating the 90° excitation, a known practice adopted for a number of different reasons consists in calibrating the 180° excitation and in deducing the amplitude of the 90° excitation therefrom by dividing by two. In all cases, the procedure consists of performing successive experiments, the amplitude of the detected signal being measured during each experiment. The generator voltage is thus caused to vary from a frst value which is, for example, lower than a given first value known as being a bottom limit for bodies of very small size to a second value which is, for example, higher than a given second value known as being necessary for excitation of bodies of large size. The curve of amplitude of the received signal is recorded as a function of the experiments and the desired value is then deduced at maximum amplitude in order to obtain a calibrated excitation.

In order to approach this maximum value with the highest possible degree of accuracy, it is necessary to vary the amplitude of excitation with a fairly small step-function interval. However, in the event of an excessively small interval of the order of 0.5 volt, for example, the calibrating operation takes too long to complete in view of the width of the range to be scanned. For example, when the operation lasts longer than twenty seconds, the user begins to suspect faulty operation of the apparatus. Speedy operation is therefore necessary. For different reasons related to the NMR phenomenon, however, successive experiments cannot be performed at a rate as high as requirements may dictate. On the contrary, they have to be separated from each other in time by an interval equal to or longer than the so-called relaxation time $T_1$ which is characteristic of the medium to be studied. In the medical field, the relaxation time $T_1$ has a value of the order of 500 milliseconds.

In order to shorten the calibration steps, an earlier suggestion made as an initial approach to the problem was not to scan the entire range but to stop as soon as the peak value of the reception signal has been detected and its amplitude continues to fall off in successive experiments. In other areas of investigation, one proposal consisted in resorting to the use of sub-ranges which were considered to be suited to a large number of patients while appreciably reducing the amplitude of the range. Calibration in this case is performed on the sub-ranges in a limited number of experiments such as sixteen, for example. If the maximum value has not been found in one sub-range, the entire calibration procedure is repeated, starting from one end of the range. The advantage of this type of procedure is extremely limited. In the final analysis, the number of failures experienced in this simplified method of scanning is too great to justify its use.

SUMMARY OF THE INVENTION

The invention proposes to overcome the disadvantage of loss of time during calibration by making use of a particular procedure of distribution of the amplitudes of excitations. The principle underlying the invention is that, since it is necessary to multiply the amplitude by two for a transition from a 90° excitation to a 180° excitation, the accuracy of determination of the value of amplitude of an excitation at 90° or at 180° is expressed as a proportion of this amplitude. From this it has accordingly been deduced that, in respect of a given accuracy of calibration, the variation in amplitude from one experiment to another should not have a constant step function but should have a progressive step function. Moreover, taking into account the variation in body resistance in proportion to the fifth power of the body diameter, it has even been possible to determine that the progression in variation of amplitude of the excitation had to be a geometrical progression in a ratio given by the requisite value of accuracy. In one example in which an error of plus or minus 7° is tolerated on a pulse at 180°, it has thus been possible to determine the fact that the common ratio of the increasing geometrical progression had a value of 1.08.

The invention is directed to a method for calibrating a radiofrequency excitation in NMR experimentation involving the steps which consist:

in exciting a body to be subjected to said experimentation with a radiofrequency excitation of given amplitude, in measuring the return response emitted by the body, in varying the amplitude of the excitation a predetermined number of times and in repeating the first two steps each time, in determining the amplitude of the excitation which is best suited to performance of the experimentation.

The method in accordance with the invention is distinguished by the fact that the amplitude is varied monotonically by progressively modifying the value of amplitude variation from one experimental step to the next.

BRIEF DESCRIPTION OF THE DRAWINGS

FIG. 1 is a schematic illustration of an NMR apparatus in which the method in accordance with the invention is carried into effect.

FIGS. 2a to 2d are diagrams showing values of detected NMR signals as a function of the voltage of the radiofrequency excitation generator.

DETAILED DESCRIPTION OF THE INVENTION

FIG. 1 illustrates an NMR apparatus in which the method of calibration in accordance with the invention is applied. This apparatus essentially includes a first element 1 for producing an orienting field $B_O$ in which a human body 2 is to be placed while resting on a movable platform 3. A resonant antenna 4 which forms part of said apparatus is provided in one example with conductive rods 5 to 8, said rods being excited by means of a resonant circuit 9 and disposed at the periphery of a fictitious cylinder 10. The patient's body is intended to be moved into position within said fictitious cylinder. A generator 11 for producing an excitation of variable amplitude is coupled to the resonant circuit 9 by means of a connecting element such as the element 12, for example. After completion of the excitation, the antenna 4 can receive the resonance signal. This signal is directed to the receiver 14 via a duplexer 13. The received signal is processed in a processing circuit 15. As a general rule, the NMR apparatus is controlled by a sequencer 16 which determines the organization of the measurement sequences.

In the present invention, the above-mentioned sequencer performs an additional function. As represented schematically by the diagram 17 of its transfer function, this additional function consists in determining the order number N of the calibration experiment which has just been undertaken, in retrieving from a memory a variation in amplitude $\Delta V_e$ of the excitation corresponding to said order number and in assigning an excitation amplitude for the experiment of the following order the previous value of said amplitude increased by the variation which has been found. In accordance with the present state of the technique, the diagram of amplitude variation as a function of the order number of the experiment was a horizontal curve 18: $\Delta V_e$ was constant. In the present invention, this diagram shows a certain progressivity. It would be possible to choose a progression 19 of the arithmetical type. Thus the modification of the amplitude variation would be constant from one experiment to the next. In this case the value of the variation would follow the order of the experiment in a linear manner.

In accordance with the present invention, it is found preferable to maintain the accuracy of appreciation of the desired calibrated value. As a result, the variation in amplitude of excitation from one experiment to the next must follow a geometrical progression. Since there is consequently a greater increase in the variations, the extreme value of the range is attained more rapidly. In fact, if the amplitude variations follow a curve 20 determined by a geometrical progression, the number of experiments required for scanning the entire range will be smaller than the number corresponding to utilization of the linear curve 19 and will in any case be appreciably smaller than the number corresponding to constancy of variation of the curve 18. For instance, in the aforementioned example of the state of the technique in which a range of 100 volts (50 volts to 150 volts) was scanned with a step-function interval of 0.5 volt, it could be necessary to perform 200 successive experiments. With a time-duration of 500 milliseconds per experiment, the entire calibration operation lasts more than one minute. In the practical application of the invention, it has been found that the number of necessary experiments was limited to about fifteen in the most unfavorable cases. This results in a calibration time of the order of 8 seconds.

The description of the transfer function 17 performed by the computer of the sequencer 16 corresponds to scanning of the range of $V_e$ with increasing values. Instructions for modifying the excitation amplitude are applied to the generator 11. FIG. 2 shows the type of investigation to which this increase in amplitude variation corresponds for calibration purposes. It will subsequently be deduced therefrom that range scanning can start from the top value, the value of amplitude variation being progressively decreased (in a geometrical progression having a ratio less than 1, and which is inverse to the preceding ratio). FIG. 2a shows the rectified amplitude of the NMR signal received on the receiver 14 as a function of the excitation voltage value.

This amplitude is zero or theoretically zero when the magnetic moments have been rotated through an angle of 180°, $V_{180}$ corresponding to nullification of said NMR signal. This waveform is repeated cyclically for all the values of $V_e$.

FIGS. 2b and 2c show what becomes of this NMR signal after it has undergone a quadratic detection and depending on whether the NMR signal corresponds to an excitation calibration involving case of a small body (a patient of small stature) or a large body (a patient of large stature). The number of lines in these graphs is equivalent to the number of calibration experiments undertaken; the experiments being undertaken to determine the excitation amplitude $V_{90}°$. The variations in excitation amplitude from one experiment to the next are equal in both cases. In both cases also, the experiments are discontinued after the peak value of the detected signal has been found.

In accordance with the invention, a value $V_{e\ min}$ is identified, this value being lower than the excitation amplitude $V_{90}$ and corresponding to the smallest body which may possibly be subjected to an NMR examination. In one example in the medical field, this small body corresponds to that of a child. Another value $V_{e\ max}$ is also identified, this value being higher than the excitation amplitude $V_{90}$ relating to the largest body examinable. It is then known that the requisite calibration amplitude must be located between $V_e$ min and $V_{e\ max}$. Systematic scanning of this range is then carried out, beginning at one end. In the example described, the end of range corresponding to the small body has been chosen. It would have been equally possible to choose the end corresponding to the largest body. From one experiment to the next, the amplitude variation changes: the experiments are closer together in amplitude and in respect of low values of excitation than in respect of high values. The number of experiments which are necessary in order to find the maximum value is smaller in FIG. 2d than in FIG. 2c. The scanning operation is also discontinued when the maximum has been found.

What is claimed is:

1. A method for calibrating a radiofrequency excitation in NMR experimentation involving the steps which consist of:
   exciting a body to be subjected to said experimentation with a radiofrequency excitation of given amplitude,
   measuring the return response emitted by the body,
   varying the amplitude of the excitation a predetermined number of times and repeating the first two steps each time,
   determining the amplitude of the excitation which is best suited to performance of the experimentation, and,
   wherein said step of varying includes the step of varying amplitude monotonically by progressively modifying the value of amplitude variation from one experimental step to the next.

2. A method according to claim 1, wherein:
   said step of varying includes the step of choosing an initial value of amplitude which is just outside a range of excitation amplitude values corresponding to the range of different bodies to be examined.

3. A method according to claim 2, wherein said step of measuring includes the step of:
   varying the measurement of the response monotonically as a function of the sequence of experiments, wherein the calibration operation is discontinued when measurement of the response begins to exhibits an inverse monotonic variation.

4. A method according to claim 1, further comprising the step of:
   modifying progressively in a geometrical progression.

5. A method according to claim 4, further comprising the step of:
   setting said geometrical progression as an increasing progression having a common ratio of 1.08.

6. A method according to claim 4, further comprising the step of:
   selecting said the geometrical progression as a decreasing progression having a common ratio of 0.926.

7. A method for calibrating a radiofrequency excitation in NMR experimentation involving the steps which consist of measuring includes the step of:
   determining an extreme excitation amplitude at which a body is to be subjected to said radiofrequency excitation,
   subjecting said body to said extreme excitation amplitude of said radiofrequency excitation,
   measuring a return response emitted by said body,
   subjecting said body to a varied excitation amplitude a predetermined number of times, each time more closely approximating said varied excitation amplitude to a second extreme excitation amplitude and each time measuring the return response emitted said varied excitation amplitude is varied by said body, wherein monotanically by progressively modifying a range of amplitude variation from one experimental step to the next, and
   determining an excitation amplitude which is best suited to said body in said NMR experimentation.

* * * * *